US006041000A

United States Patent [19]

McClure et al.

[11] Patent Number: 6,041,000

[45] Date of Patent: Mar. 21, 2000

[54] INITIALIZATION FOR FUSE CONTROL

[75] Inventors: David C. McClure, Carrollton; Tom Youssef, Dallas, both of Tex.

[73] Assignee: STMicroelectronics, Inc., Carrollton, Tex.

[21] Appl. No.: 09/183,840

[22] Filed: Oct. 30, 1998

[51] Int. Cl.[7] .......... G11C 7/00

[52] U.S. Cl. .......... 365/200; 365/225.7; 365/230.06

[58] Field of Search .......... 365/200, 225.7, 365/230.06

[56] References Cited

U.S. PATENT DOCUMENTS 5,568,061 10/1996 McClure .
5,825,698 10/1998 Kim et al. .......... 365/200
5,907,514 5/1999 Lee et al. .......... 365/225.7

*Primary Examiner*—Huan Hoang
*Attorney, Agent, or Firm*—Theodore E. Galanthay; Lisa K. Jorgenson; Andre Szuwalski

[57] ABSTRACT

A circuit and method are provided for generating an initializing signal to a master enable fuse circuit on a redundant line decoder. An initialization pulse may be applied to a master enable circuit having a master enable fuse. The master enable fuse may be coupled to a switched voltage supply powered selectively by battery voltage and external Vcc. A circuit for generating the INITIAL signal determines the transition from a power down state to a powered state. A series of delay elements in a generating circuit generates a predetermined initialization pulse of around 3 ns to 5 ns. Half-latch circuits may be initialized between a first and second voltage threshold. Accordingly, the master enable circuits may be set to the proper initialization states for proper operation and minimum power consumption.

16 Claims, 10 Drawing Sheets

INITIALIZATION FOR FUSE CONTROL

CROSS REFERENCE TO RELATED APPLICATIONS

This application is related to U.S. patent application entitled "Redundant Line Decoder Master Enable", by David C. McClure, Ser. No. 08/492,219, now U.S. Pat. No. 5,568,061 which is incorporated herein by reference.

FIELD OF THE INVENTION

The present invention relates to redundant line decoding in a semiconductor memory array. In particular, the present invention relates to a circuit for powering and initializing a fused master enable circuit for enabling a redundant line decoder.

BACKGROUND OF THE INVENTION

Redundant memory lines are often used in semiconductor memory arrays to prevent an isolated cell defect from rendering an entire array unusable and thereby reducing processing yield. During the normal operation of a memory array without cell defects, master enable fuses for redundant memory lines remain intact thereby preventing the generation of master enable signals for associated redundant decoder circuits, which accordingly remain inactive. However, during electrical test after wafer processing, cell defects may be discovered and identified by location. Defective cells may be disconnected from the memory array by blowing fuses which may be, for example, laser blown fuses, current blown fuses or the like. Redundant memory line decoder circuits may be then enabled by blowing master enable fuses associated with a particular redundant row or column decoder using, for example, a laser device. By blowing master enable fuses, enable circuits may be configured to generate enable signals for redundant line decoder circuitry. Accordingly, addresses of defective cells are remapped to redundant memory lines through redundant decoders which have been enabled in the manner described above and which is described in greater detail in U.S. Pat. No. 5,568,061, previously cited.

Problems arise, however, initializing master enable circuits in semiconductor memory arrays which use redundancy control logic. In memory arrays, particularly those which provide for battery back-up, current related anomalies may arise. Excess current may be drawn, for example, by inactive master enable circuits which are subjected to initialization nonetheless. Other factors leading to excess current consumption and improper operation include, for example, indeterminate states in master enable circuit latches, and battery currents generated when portions of a memory array are powered by an external voltage supply operating at intermediate voltage levels and other portions are powered by a voltage supply which is switched from external voltage to battery voltage.

Master enable fuse circuitry is frequently associated with sequential logic for setting proper voltage and/or logic levels in related circuits, for example redundant memory line decoder circuits. As a result of the use of sequential logic however, the state of the logic circuitry associated with a blown master enable fuse can be indeterminate when power is initially applied during, for example, initial power up. Previous master enable fuse circuits have relied on junction leakage currents to eventually drag latch input nodes to a known state. However, master enable fuses which retain a slight conduction path even after being blown may prevent leakage giving rise to indeterminate states for latch inputs. Indeterminate states within integrated circuits can result in parts which are unreliable or unstable and which dissipate excessive power. Such anomalies may lead to shortened back-up battery life and/or excess current consumption during normal memory operation leading to crowbarring of circuit elements. Excess current consumption is particularly troublesome in parts which are rated for power efficiency.

Moreover, in prior art memory array circuits, critical memory cell circuitry for non-volatile memory devices has been powered by a "switched" voltage bus. The switched bus, which is powered by an external voltage supply, e.g. external Vcc, during power up, switches to battery power during power down transitions when the externally supplied voltage level drops below a critical voltage level. By providing battery back up in such a manner, memory cell contents are protected from degradation or alteration during power down. In order to conserve battery power, however, non-critical related circuits are not typically configured for battery back up giving rise to the need for multiple power busses throughout the part. The additional busses increase costs and complexity of manufacture for the part.

Master enable circuits have previously been powered by external Vcc and initialized with a signal having a voltage level such that, for inactive master enable circuits, e.g. circuits with the master enable fuse intact, the initialization signal caused current to be drawn from Vcc for the inactive master enable circuit during normal operation of the memory array.

It would be desirable therefore for a circuit and method for minimizing excess currents associated with fused master enable circuitry in integrated circuits and ensuring fused master enable circuits are in the proper initial states at power up from battery or external voltage supplies. It would further be desirable for such a circuit and method which minimizes the number of power busses throughout the integrated circuit.

SUMMARY OF THE INVENTION

The present invention overcomes the above identified problems as well as other shortcomings and deficiencies of existing technologies by providing a circuit and method for generating an initializing signal to a master enable fuse circuit associated with a redundant memory line decoder. An initialization pulse may be generated at a predetermined voltage level. The predetermined voltage level may be at a level between a first and second voltage threshold. The first and second voltage thresholds may be voltage levels which occur during the ramp up of a power supply from zero voltage to full operating voltage.

The initialization pulse may be applied to a first junction of a circuit element which is coupled to the second terminal of a master enable fuse element and the input of a first inverter element. The first terminal of the master enable fuse element may be coupled to a switched voltage supply bus which is powered by battery voltage during power down and external voltage during power up. Accordingly, during a time interval in which the switched voltage supply bus transitions to full external power, an initialization signal may be generated for initializing a half-latch associated with the master enable circuit before the memory device is accessed during normal operation.

A circuit for generating an INITIAL signal includes a voltage reference circuit for determining the predetermined voltage level. A power down signal may be generated at the predetermined voltage level and input to a series of delay elements for generating a pulse having a relatively narrow, predetermined pulse width. The output of the series of delay elements and the power down signal may be connected to a second logic element for forming the INITIAL signal. A master enable fuse circuit may be coupled to each redundant line in a redundant row decoder and to each redundant line in a redundant column decoder.

The INITIAL signal may be applied to one or more half-latch circuits associated with one or more master enable fuse circuits at a predetermined voltage level between the first and second voltage threshold. Accordingly, by applying the INITIAL signal pulse, the half-latch circuits for active master enable circuits may be initially set to a known state and inactive master enable circuits may draw power only during the pulse interval minimizing excess current consumption for unused circuits.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
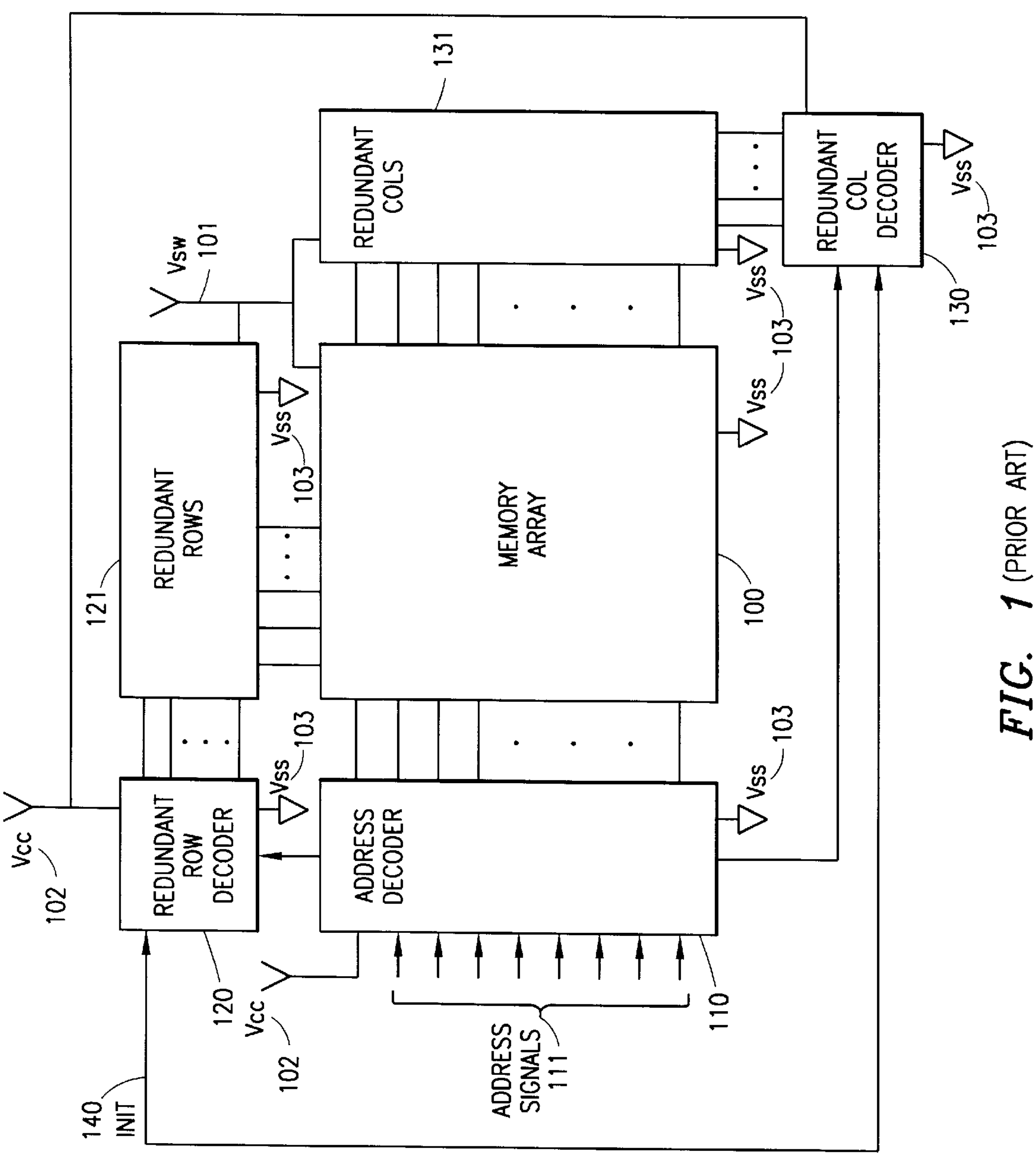
FIG. 1 is a block diagram illustrating a prior art memory array including redundant line decoders.

Referring to FIG. 1, a block diagram of an exemplary prior art memory array having redundant memory lines is described. Memory array 100 is shown coupled to address decoder 110, redundant row decoder 120, and redundant column decoder 130. It is important to note that in prior art memory array circuits, non-critical memory circuits, for example, address decoder 110, redundant row decoder 120, redundant column decoder 130, are powered using an external voltage supply Vcc 102. Critical memory circuits may be powered using a "switched" voltage supply Vsw 101 to accommodate the use of battery backup to preserve memory cell contents after power down or failure of external Vcc 102.

If cell defects are discovered in memory array 100, cell addresses may be remapped to replacements cells using redundant memory lines, e.g. redundant rows 121 and redundant cols 131. Redundant row decoder 120 and redundant column decoder 130 may be enabled by blowing associated master enable fuses and initializing the master enable circuits by applying INIT signal 140, which, in the prior art, is a constant logic level to be described in more detail hereinafter.

Figure 2A:
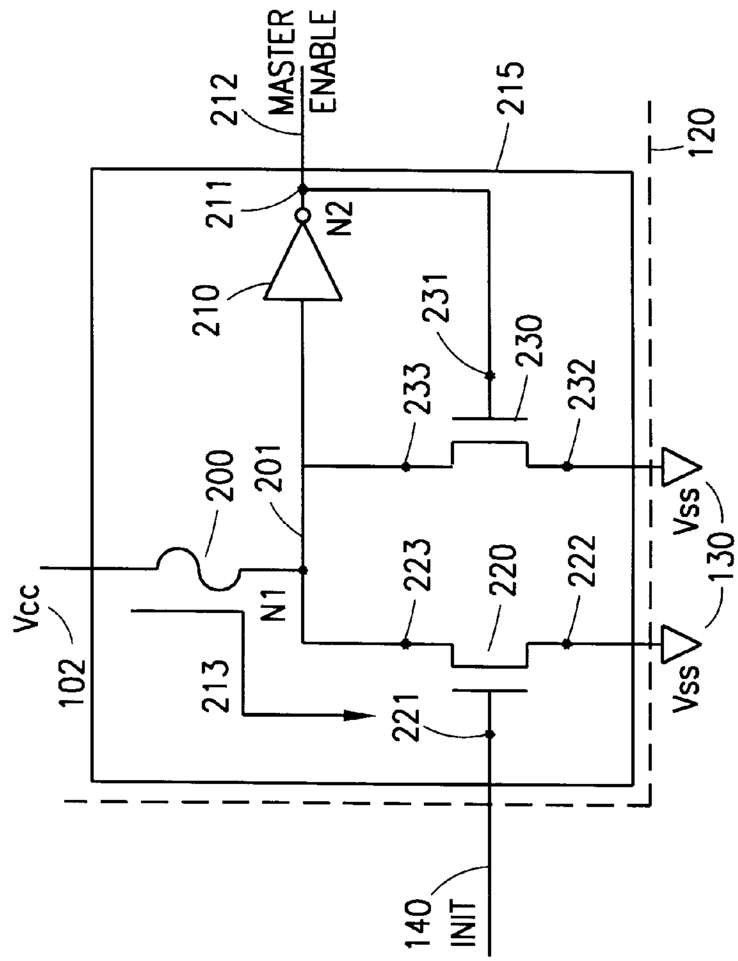
FIG. 2A is a schematic diagram illustrating a prior art master enable fuse circuit and the application of an INIT signal.
Figure 2B:
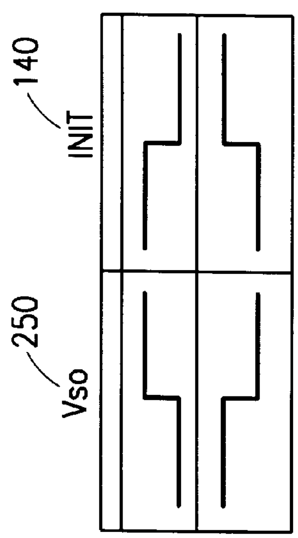
FIG. 2B is a timing diagram illustrating the state of an INIT signal with respect to a voltage level.

Problems arise, however, initializing prior art master enable circuits associated with memory array 100, particularly when provided with battery back-up, as current related anomalies may occur. Referring now to FIG. 2A, a schematic diagram of an exemplary master enable circuit of the prior art is shown. Master enable fuse 200 is coupled to Vcc 102 and to node N1 201 at the input of inverter 210 which ultimately generates a master enable signal 212 for further enabling, for example, redundant row decoder 120 and redundant column decoders 130. It should be noted with reference to FIG. 2B that INIT signal 140 is inversely related to Vso 250 or a derivative signal thereof in the manner shown. If Vso 250 is a logic low indicating that memory array 100 is operating from external Vcc 102, INIT signal 140 is a logic high which activates control junction 221 of junction device 220. With master enable fuse 200 intact, junction device 220 attempts to pull node N1 201, and thus Vcc 102, to Vss 130 (ground) creating an undesirable current 213 from Vcc 102 to Vss 130. Current 213 is particularly troublesome, since it continues during the operation of memory array 100 as long as INIT signal 140 is at a logic high level. Since INIT signal 140 maintains a continuous logic high state during operation, control junction 221 of junction device 220 is continuously biased and current 213 continues to flow from Vcc 102.

Since junction device 220 cannot successfully pull node N1 201 to ground potential at Vss 130 with master enable fuse 200 intact, inverter 210 continuously sees a level at its input that is considered to be high and thus, node N2 211 and therefore master enable signal 212 is held low. Because node N2 211 remains low, control junction 231 of junction device 230 remains low and junction device 230 remains unbiased allowing node N1 201 to remain at a level considered high. Accordingly current 213 will continue to flow while INIT signal 140 is applied to master enable circuit 215 in the manner described with master enable fuse 200 intact.

However, if master enable fuse 200 is blown, indicating that the redundant memory line decoder associated therewith should be enabled, INIT signal 140, when applied to control junction 221 of junction device 220, pulls node N1 201 to Vss 130 creating a logic low on the input of inverter 210. Since node N1 201 is now at logic low, inverter 210 generates a logic high level for master enable signal 212 and at node N2 211 which in turn biases control junction 231 of junction device 230 and effectively "locks" node N1 201 low. Master enable signal 212 is locked to a logic high and any redundant memory line decoder circuits coupled thereto are accordingly locked in the enabled state during the operation of memory array 100.

Figure 3:
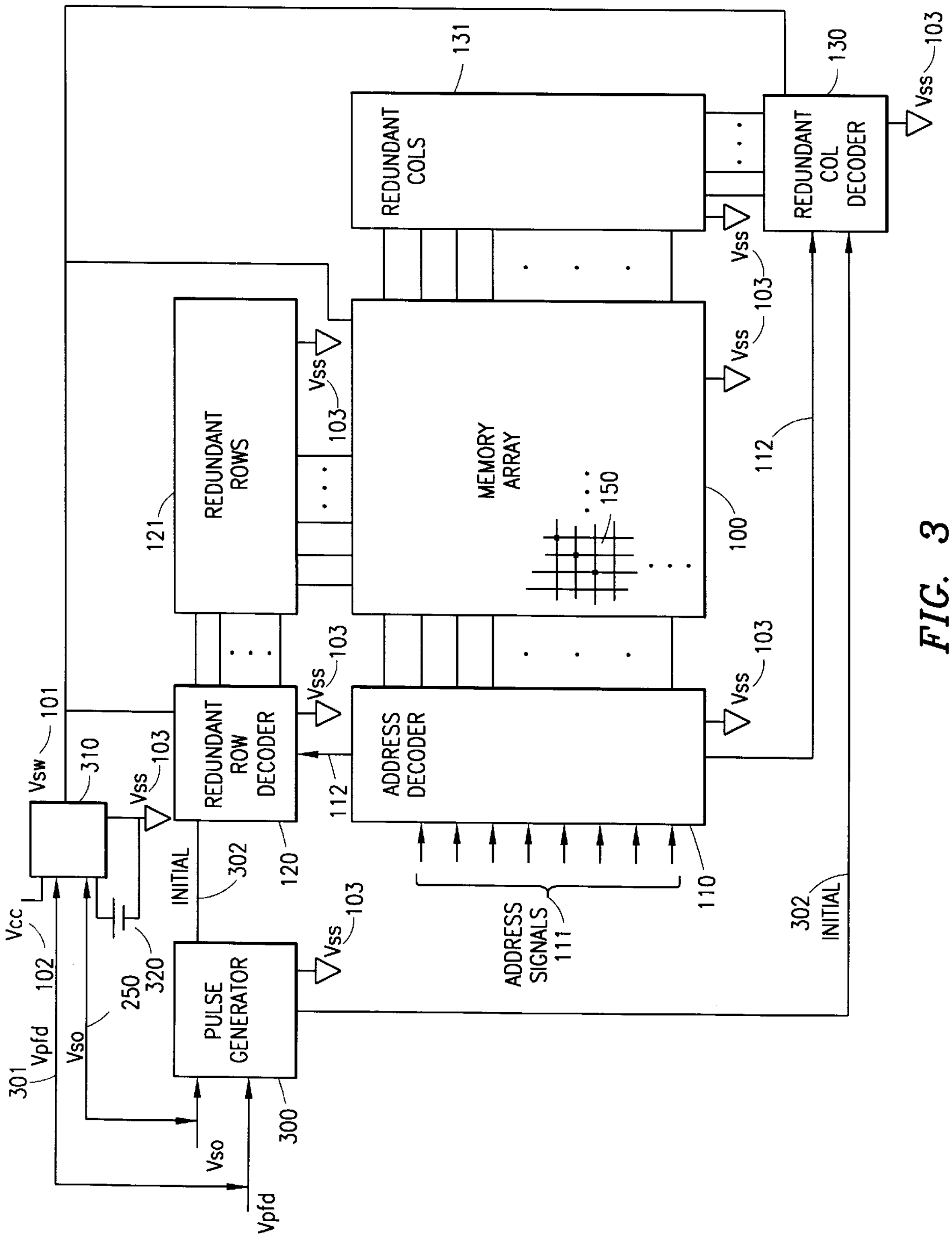
FIG. 3 is a block diagram illustrating memory array including redundant line decoders and including an initialization circuit in accordance with the present invention.

In the preferred embodiment of the present invention, undesirable current 213 may be eliminated and other advantages attained as described hereinafter. Referring now to FIG. 3 of the drawings, memory array 100 is shown with address decoder 110, redundant row decoder 120, and redundant column decoder 130. Memory cells 150 may be accessed in the manner previously described during testing and, if defects are present, redundant rows 121 and redundant columns 131 may be accessed by remapping defective cell addresses to redundant cell addresses. Remapping may be accomplished by enabling redundant row decoder 120 and redundant line decoder 130 using master enable circuit 215 in the manner described above. It should be noted that, in contrast with memory array circuits of the prior art, all circuits are powered by switched power Vsw 101 provided through voltage sensing and switching circuit 310, which may multiplex battery voltage from battery 320 or external Vcc 102 to a single power bus represented by Vsw 101. By eliminating multiple power busses, die complexity may be reduced and die size savings may be attained. Further advantages of using Vsw 101 for powering memory array 100 and all associated circuits which incorporate the teachings of the present invention may be realized in the area of addition current consumption savings through voltage sensing and switching circuit 310.

Circuitry powered by Vsw 101, for example master enable circuit 215, draws current from battery 320 and external Vcc 102 through a switch (not shown), which, in the preferred embodiment may be a transistor switch well known in the art, and which may be controlled in a manner also well known in the art. It is desirable therefore to minimize the current drawn through master enable circuit 215, and thus through the switch controlling the source from which Vsw 101 is powered, e.g. Vcc 102 or battery 320. Accordingly, master enable circuit 215 associated with master enable fuse 200 may be prevented from drawing excess current if initialization is accomplished using a pulse rather than a signal with a constant voltage level.

In addition, by using switched Vsw 101 to power a majority of circuits in memory array 100, current paths between portions of a prior art memory array circuit operating at Vsw 101 while at battery voltage and other portions operating from external Vcc 102 at an intermediate voltage level of may be eliminated. Voltage sensing and switching circuit 310 may be used to determine the switch over point by monitoring Vcc 102 for voltage levels, for example, Vso 250 and Vpfd 301 and generating signals indicative of such voltage levels being reached and/or by responding to externally generated signals Vso 250 and Vpfd 301. Voltage Vso 250 and Vpfd 301 may further be input to pulse generator 300. It should be noted that Vso 250 and Vpfd 301 may be actual voltage levels or may be logic signals indicative of actual voltage levels being reached as sensed by voltage sensing and switching unit 310.

Memory array 100 incorporating the teachings of the present invention typically has three distinct modes of operation. In one mode, memory array 100 is fully enabled, and operating from Vsw 101 operating at external voltage level Vcc 102 (normal operation). When Vcc 102 drops below a first voltage threshold Vpfd 301, memory array 100 is forced to be disabled from reading and writing while still operating from external Vcc 102. When external voltage level Vcc 102 drops below a switch over voltage threshold, Vso 250, critical portions of the memory array 100 are powered by battery 320.

In prior art systems, as previously described, master enable fuse 200 was coupled to external Vcc 102 and initialization occurred, if at all, only during switching to battery power and then by using a continuous logic level for INIT signal 140. If master enable fuse 200 was intact, current 213 was drawn from external Vcc 102, as described. On large density devices (≧256K) the cumulative current represented by current 213 could be significant based on the number of redundant elements. In contrast, INITIAL signal 302, in accordance with the present invention, is generally low and may be pulsed high during a particular interval between Vso and external Vcc 115 when the switch over to Vcc occurs thus minimizing excess currents.

Figure 4:
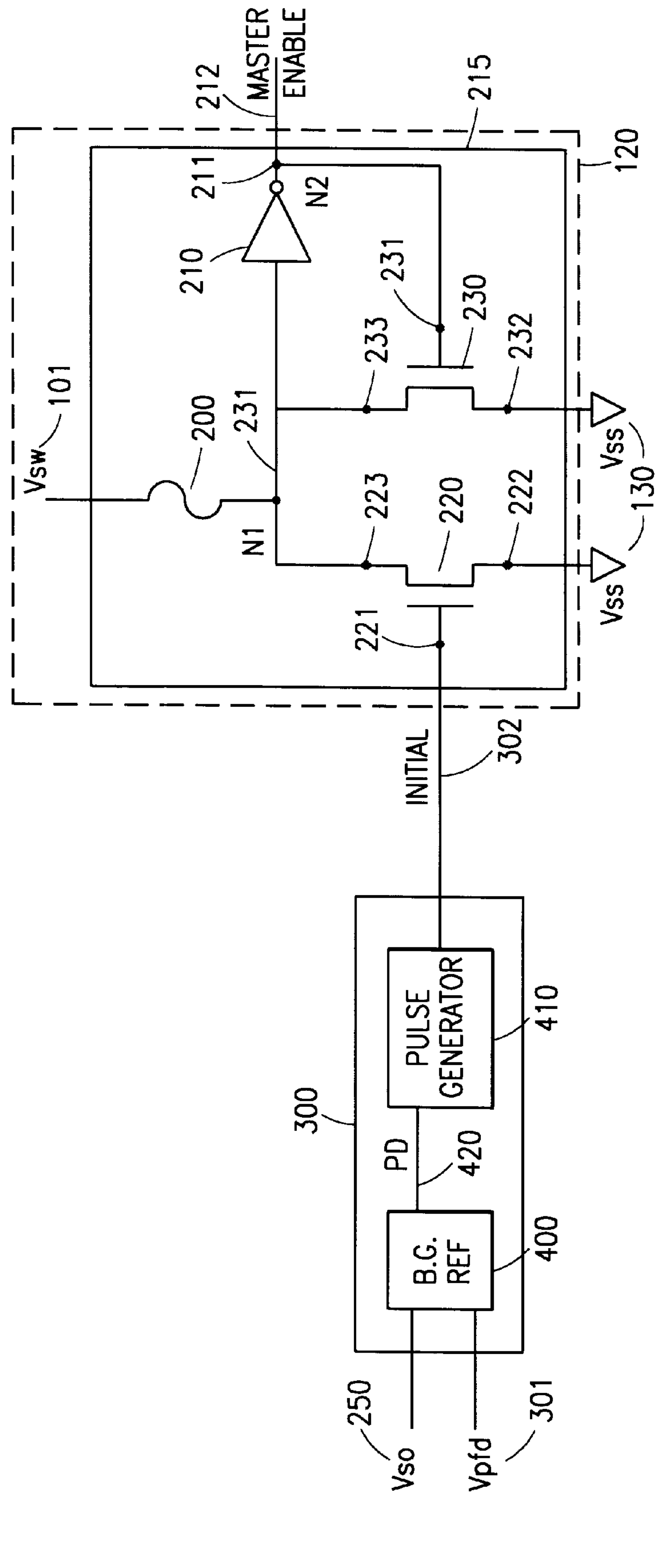
FIG. 4 is a schematic diagram illustrating an initialization circuit coupled to an exemplary master enable fuse circuit for generating an INITIAL signal in accordance with the present invention.

Pulse generator 300 is shown in greater detail with reference to FIG. 4 of the drawings. Vso 250 and Vpfd 301 are shown as being input to bandgap reference 400 to illustrate that a reference voltage may be set using either Vso 250 or Vpfd 301 or a voltage level between Vso 250 and Vpfd 301. It should be noted that for setting a voltage reference in bandgap reference 400, it is preferred that voltage levels Vso 250 and Vpfd 301 be used rather than logic levels indicative of voltage levels Vso 250 and Vpfd 301 as will be evident from a more detailed description of the operation of bandgap reference 400 found hereinafter. When the desired voltage threshold is reached, bandgap reference 400 may generate PD signal 420, which may be input to pulse generator 410 for generating INITIAL signal 302. INITIAL signal may then be input to master enable circuit 215 in accordance with the present invention with fuse 200 now coupled advantageously to Vsw 101. Initialization of master enable circuit 215 may proceed in a similar manner as described in reference to FIG. 2A, however, in contrast to INIT signal 140, INITIAL signal 302 is not a continuous level.

In order to achieve initialization in a manner in accordance with the present invention, node N1 201 is required to be low for only a few nanoseconds in order for the corresponding high signal generated at node N2 211 at the output of inverter 210 to bias junction device 230. By biasing junction device 230 with a short pulse, node N1 201 is thereby locked low via the feedback to control junction 231 of junction device 230 thus locking master enable signal 212 high. If master enable fuse 200 is not blown indicating that it is not desired to enable the redundant line associated therewith, INITIAL signal 302 causes a short pulse on master enable signal 212 but otherwise has no effect since junction devices 120 and 130 cannot pull down the voltage supply and may only attempt to do so for a time intervals corresponding to the pulse width of INITIAL signal 302 which, as described, is in the order of a few nanoseconds.

It is understood that a semiconductor memory array 100 may employ a number of master enable circuits 215 in order to control row and column decoder circuitry 120 and 130. Because master enable circuits 215 are initialized concurrently and because master enable fuse 200 of some of the master enable circuits 215 may not be blown, an appreciable amount of current may be drawn by idle master enable circuits 215 during the time in which INITIAL signal 302 is asserted as described. Current draw during the initialization period is especially critical due to the initialization period possibly occurring at or around the time when battery 310 provides power to switched power supply Vsw 101, depending upon the selection of the threshold voltage at which power down signal PD 420 changes state. In addition, current draw is preferably minimized in order limit the current drawn through a switch or pass element within voltage sensing and switching circuit 320 as also described. As a result, INITIAL signal 302 preferably has a relatively narrow pulse width. Accordingly, the transistors in delay element 525, to be described in detail hereinafter, are preferably sized so that the pulse width provided by pulse generation circuit 500, also to be described in more detail hereinafter, is wide enough to activate junction device 220 to pull node N1 201 to Vss 103 yet narrow enough to limit current draw. In a preferred embodiment of the present invention, delay element 525 is designed to provide INITIAL signal 302 with a pulse width of approximately 3–5 ns.

Figure 5:
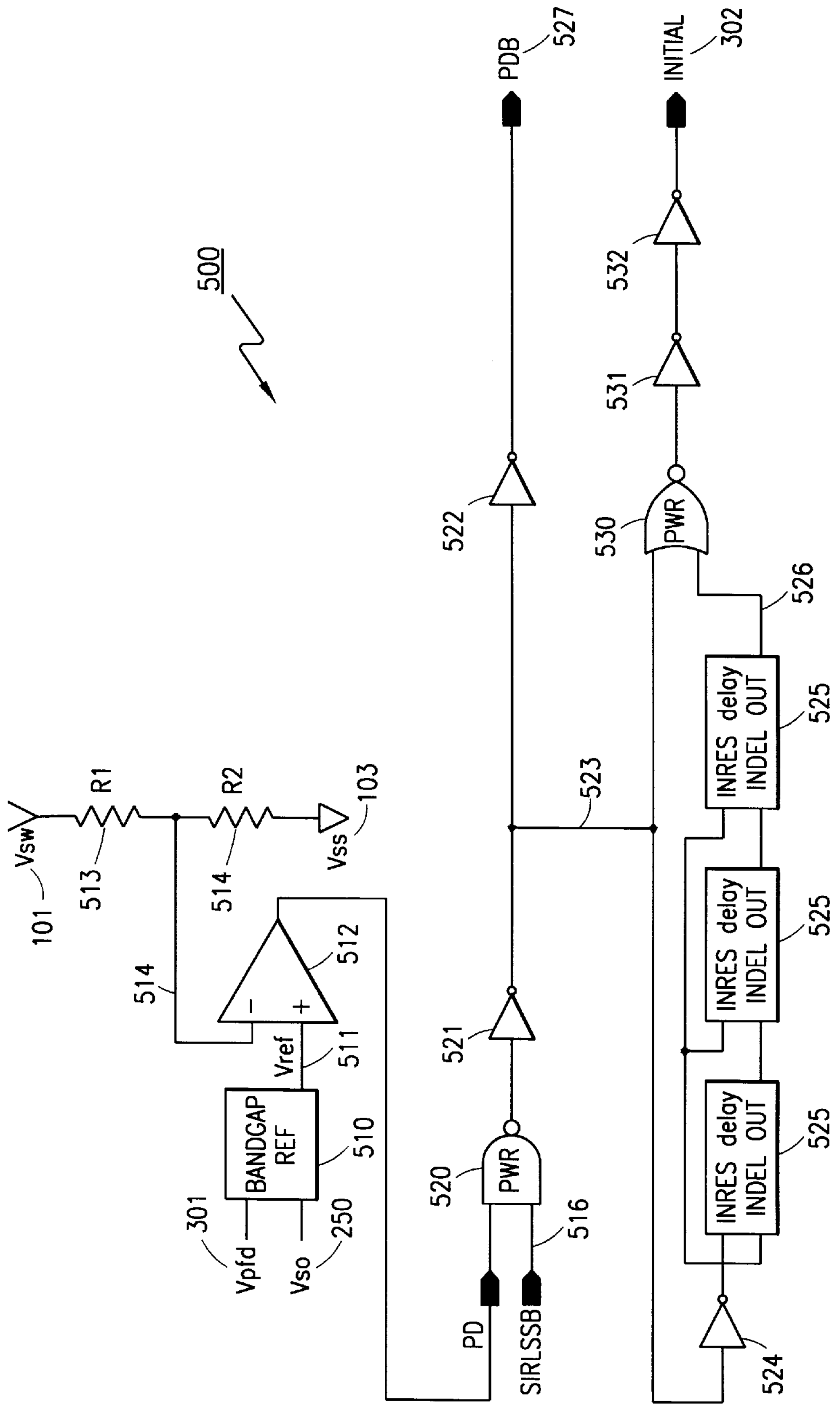
FIG. 5 is a schematic diagram illustrating a pulse generation circuit in accordance with the present invention.

To more fully appreciate the generation of INITIAL pulse 302 reference is now made to FIG. 5 of the drawings. Bandgap reference 400 is configured to provide a high quality voltage reference as is well known in the art and may be used to establish a reference voltage Vref 511 which may be input to the non-inverting terminal of comparator 512. Vref 511 may be set to Vso 250, Vpfd 301, or may be set to a voltage level in between Vso 250 and Vpfd 301 to establish the voltage level at which power down PD signal 420 may be generated. In the preferred embodiment of the present invention, Vref 511 may be equal to Vpfd 301. To relate the voltage level of Vcc 102 to Vref 511 during operation, resistor R1 513 and resistor R2 514 may be coupled between Vcc 102 and Vss 103 to establish a common voltage divider circuit. Accordingly, a voltage level may established at node 514 which is the input to the inverting terminal of comparator 512, such that when Vcc 102 reaches the predetermined voltage represented by Vref 511, PD signal 420 may be generated. PD signal 420 may be used to begin the generation of INITIAL signal 302 as is further illustrated in FIG. 5. Pulse generation circuit 500 includes NAND gate 520 and inverter 521, the output of which drives node n8 523. The input signals for NAND gate 520 may include a normally high stress test signal STRESSB and power down signal PD 420. Power down signal PD 420 is preferably an active low, normally high signal which is asserted when the output of the external power source, e.g. Vcc 102 reaches the voltage threshold established by Vref 511, as stated above. Pulse generation circuit 500 preferably includes delay elements 525, each of which provides propagation delay times between a falling edge transition appearing on its input and a delayed rising edge transition appearing on its output.

Figure 6:
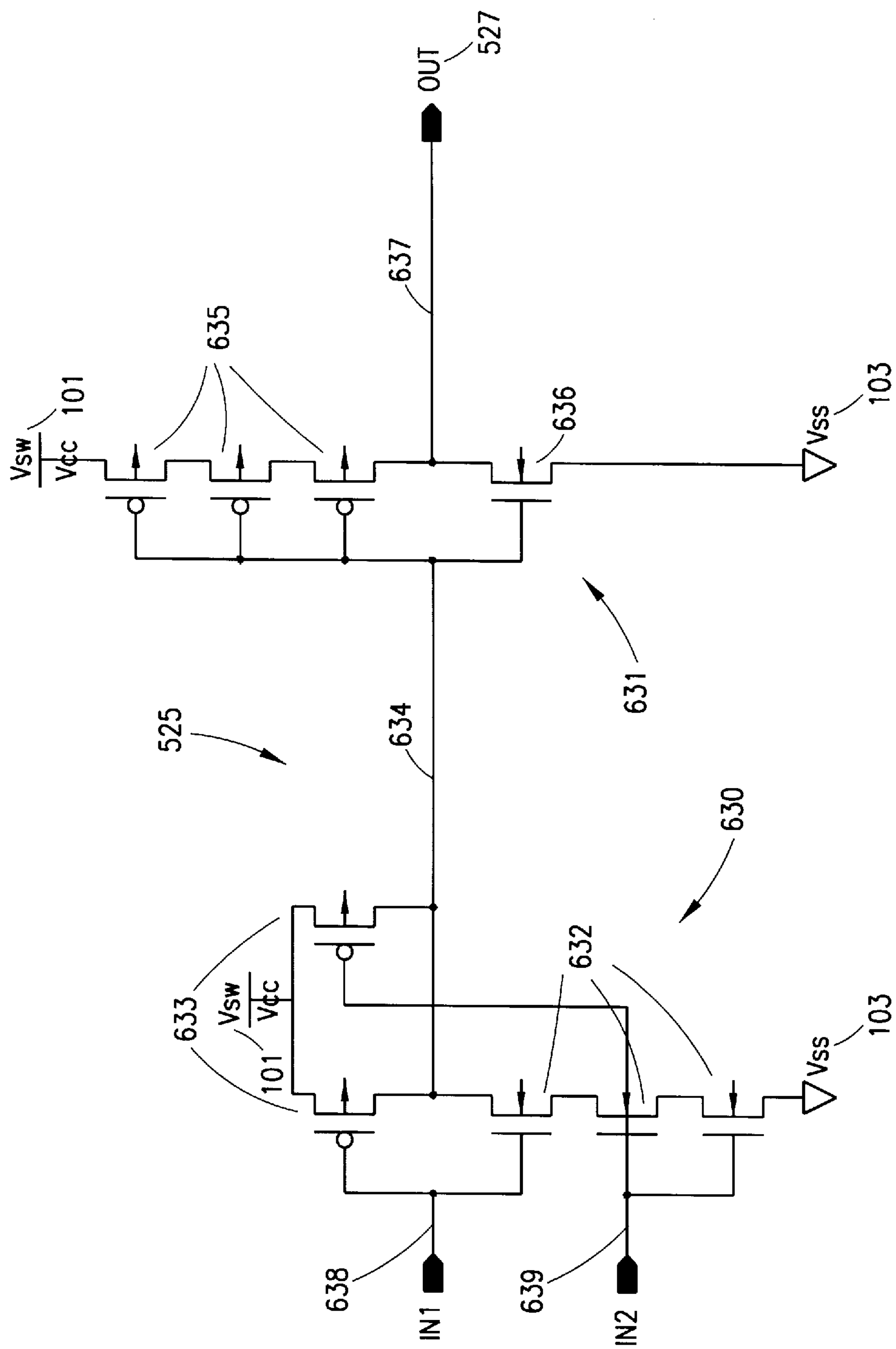
FIG. 6 is a schematic diagram illustrating a delay circuit in accordance with the present invention.

Referring now to FIG. 6 of the drawings, delay elements 525 include a transistor circuit in which current flows through a stack of series-connected transistors. By providing two cascaded stacked circuits 630 and 631, a delay differential is created between an input edge rising transition and an output rising edge transition. Circuit 630 of delay element 525 may include a two input NAND gate in which three pull-down devices 632 are arranged in a stacked relation and two pull-up devices 633 are arranged in a parallel relation. As a result, the rising edge delay for NAND gate output signal 634 is greater than its falling edge delay with respect to corresponding input edges.

Circuit 631 of delay element 525 may include an inverter gate having three pull-up devices 635 connected in series with one pull-down device 636. Consequently, the inverter output signal 637 has a rise time delay which is greater than its fall time delay. As can be seen, delay element 525 comprises a two-input AND gate in which a falling edge transition appearing on either input signal IN1 638 or IN2 639 quickly creates a falling edge transition appearing on output signal OUT 637, and a rising edge transition appearing on either input signal IN1 638 or IN2 639 creates a rising edge transition which is delayed relative to the input rising edge transition.

Referring again to FIG. 5, pulse generation circuit 500 includes three delay elements 525 connected in series in which an output of the first delay element 525 drives an input of the second delay element 525, and so on. The output of the final series delay element 525 drives a first input of a logic gate which, in the preferred embodiment, is a two-input NOR gate 530. Node n8 523, which provides the second input for NOR gate 530, provides the input to delay elements 525, via inverter 524 creating a rising edge corresponding to the falling edge of PD signal 420. The combination of delay elements 525, NOR gate 530 and inverter 524, forms a monostable multivibrator or one-shot device in which the falling edge transition of PD signal 420 appearing on node n8 523 causes the output of NOR gate 530 to relatively quickly transition to the logic level high state since both inputs are now low. Simultaneously, the falling edge transition appearing on node n8 523 propagates through inverter 524 and is input to delay elements 525 as a rising edge and, after a predetermined delay time, causes node n4 526 to transition high. The high transition at node n4 526 causes the output of NOR gate 530 to transition back to a logic level low state after the predetermined delay time. The predetermined delay period may correspondingly establish the pulse width of INITIAL signal 302 which is generated after the output of NOR gate 530 passes through inverters 531 and 532.

Figure 7A:
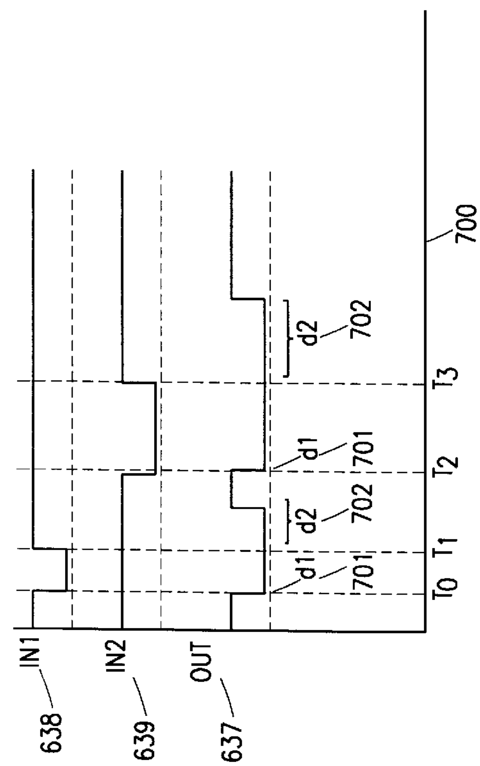
FIG. 7A is a timing diagram illustrating the timing relationships in the exemplary delay circuit as shown in FIG. 6.
Figure 7B:
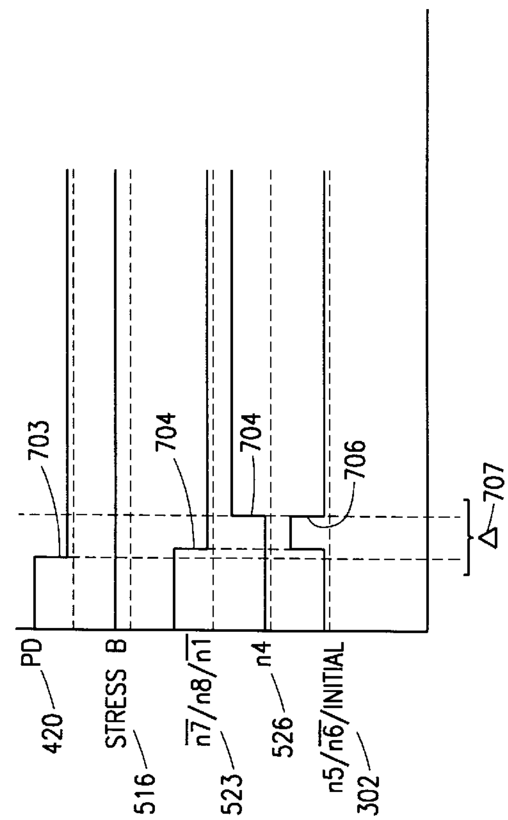
FIG. 7B is a timing diagram illustrating the timing relationships in the exemplary pulse generation circuit as shown in FIG. 5.

The timing relationships between the significant events described may be further illustrated with reference to FIG. 7A and 7B of the drawings. FIG. 7A illustrates the transition of IN1 638 or IN2 639 with reference to FIG. 6 and the response to rising and falling edges thereof. At time T0, a falling edge is seen on signal IN1 638, and a corresponding falling edge is seen on OUT signal 637 with delay d1 701 being relatively small. At time T1, a rising edge is seen on signal IN1 638 and at a delay d2, OUT signal 637 transitions high. Time delay d2 may be considered the delay through each delay element 525. With reference now to FIG. 7B, the timing relationships between events described in relation to FIG. 5 may be illustrated. Falling edge 701 of PD signal 420 may begin the generation of INITIAL signal 302, as illustrated with the corresponding rising edge thereof. Node n8 523 input to NOR gate 530 has a falling edge 704 corresponding to falling edge 703. Simultaneously, falling edge 704 is input to inverter 524 creating a rising edge on the series of delay elements 525. After the predetermined delay established by delay elements 525 has elapsed, a rising edge 705 is seen at node n4 526 which is input to NOR gate 530. The effect is that the output of NOR gate 530 which corresponds to INITIAL signal 302 through inverters 531 and 532, is a pulse 706 with a width 707 corresponding to the delay established by delay elements 525.

Figures 8A, 8B:
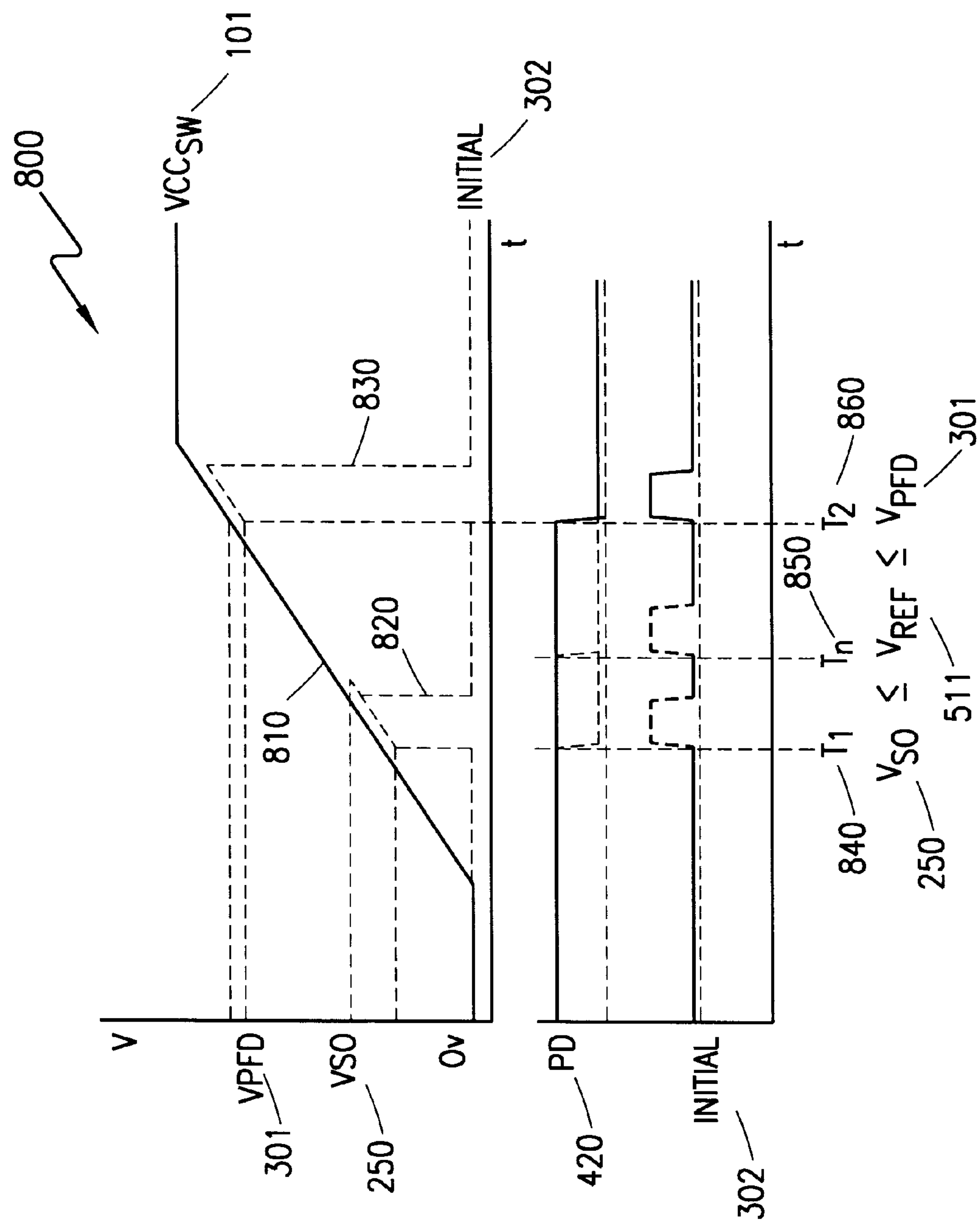
FIG. 8A is a graph illustrating the ramp-up of a power supply voltage including Vso and Vpfd voltage thresholds.
FIG. 8B is a timing diagram illustrating an initialization pulse in relation to a voltage level in accordance with the present invention.

To better understand the generation of INITIAL signal 302, reference is now made to FIG. 8A of the drawings. As previously described in reference to FIG. 5, the generation of INITIAL signal 121 is controlled by the generation PD signal 420. It is desirable for INITIAL signal 302 to be short and, in the preferred embodiment is about 3–5 ns wide. Accordingly, INITIAL signal 302 as shown in FIG. 8A may track the falling edge of PD signal 420. The high going INITIAL signal 302, shown in FIG. 8A, alternatively, by way of example, in two positions as pulses 820 and 830, can be generated in reference to at least two events shown as voltage thresholds. The first voltage threshold represents the voltage level at which Vsw 101 switches from battery 310 to external Vcc 102 at switch over voltage Vso 250 in the case of pulse 820. The second voltage threshold represents Vcc 102 passing through Vpfd 302 as memory array 100 becomes enabled for reading and writing. While pulses 820 and 830 are shown as being generated at Vso 250 and Vpfd 302, by way of example of when INITIAL signal 302 can be generated, in the preferred embodiment, INITIAL signal 302 may be generated anywhere between Vso 250 and Vpfd 302.

As best shown in FIG. 8B of the drawings INITIAL signal 302 may be generated relative to the voltage level of Vcc 102 in accordance with the present invention. Since PD signal 420 may be generated with respect to the level of Vcc 102 as determined by voltage sensing and switching circuit 320 as previously described, the relationship between Vcc 102 and the generation of INITIAL signal 302 may be by way of PD signal 420. The relationship is as follows. A falling edge on PD signal 420 corresponds to the rising edge of INITIAL signal 302 as shown at T1 840, Tn 850, and T2 860. Such times represent possible times for generation of the rising edge of INITIAL signal 302 as determined by the voltage set point of Vref 511 and the time when the voltage level represented by Vref 511 is reached by Vcc 102.

Figure 9:
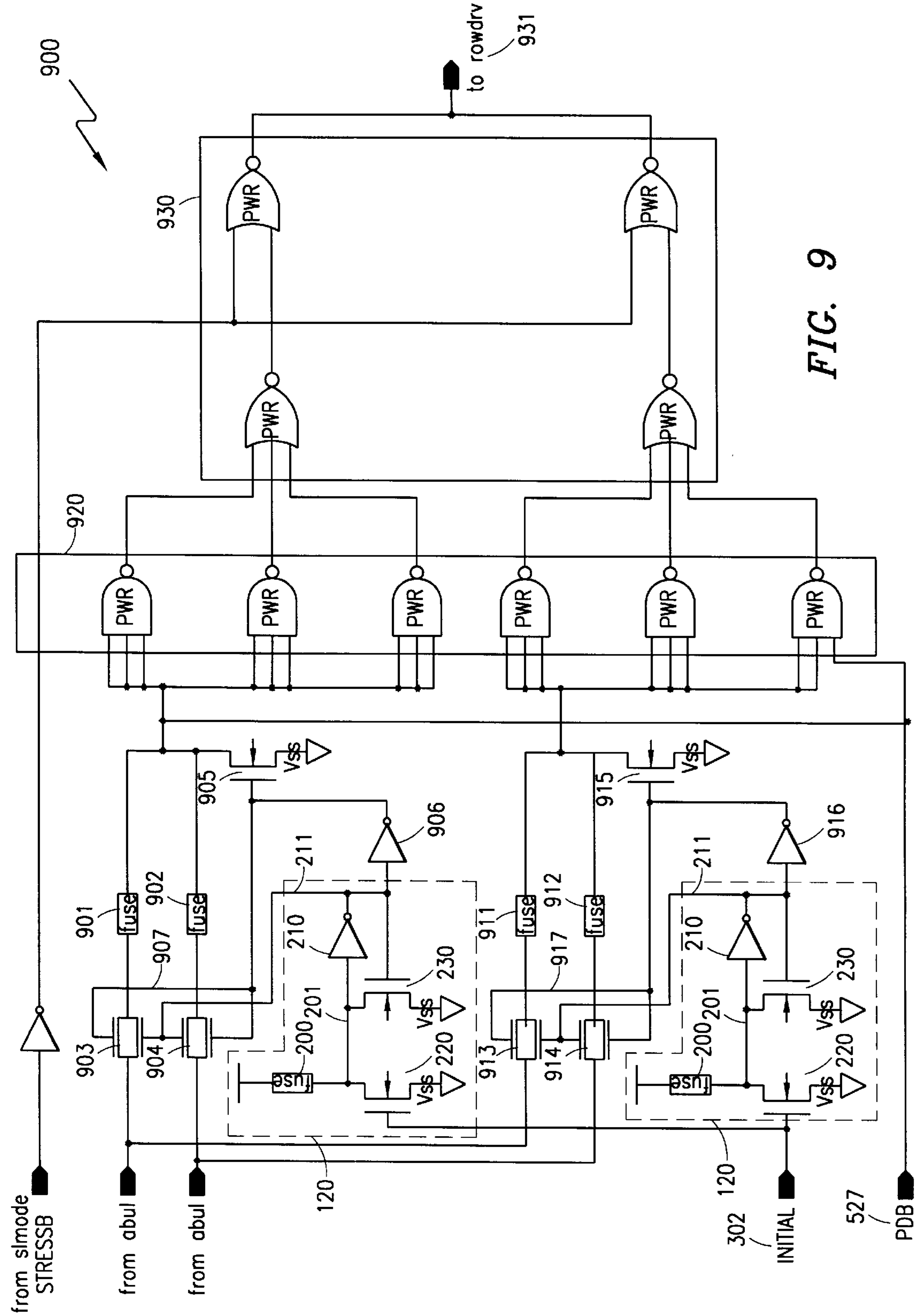
FIG. 9 is a schematic diagram illustrating master enable fuse circuits in accord with the present invention in a redundant row decoder.
Figure 10:
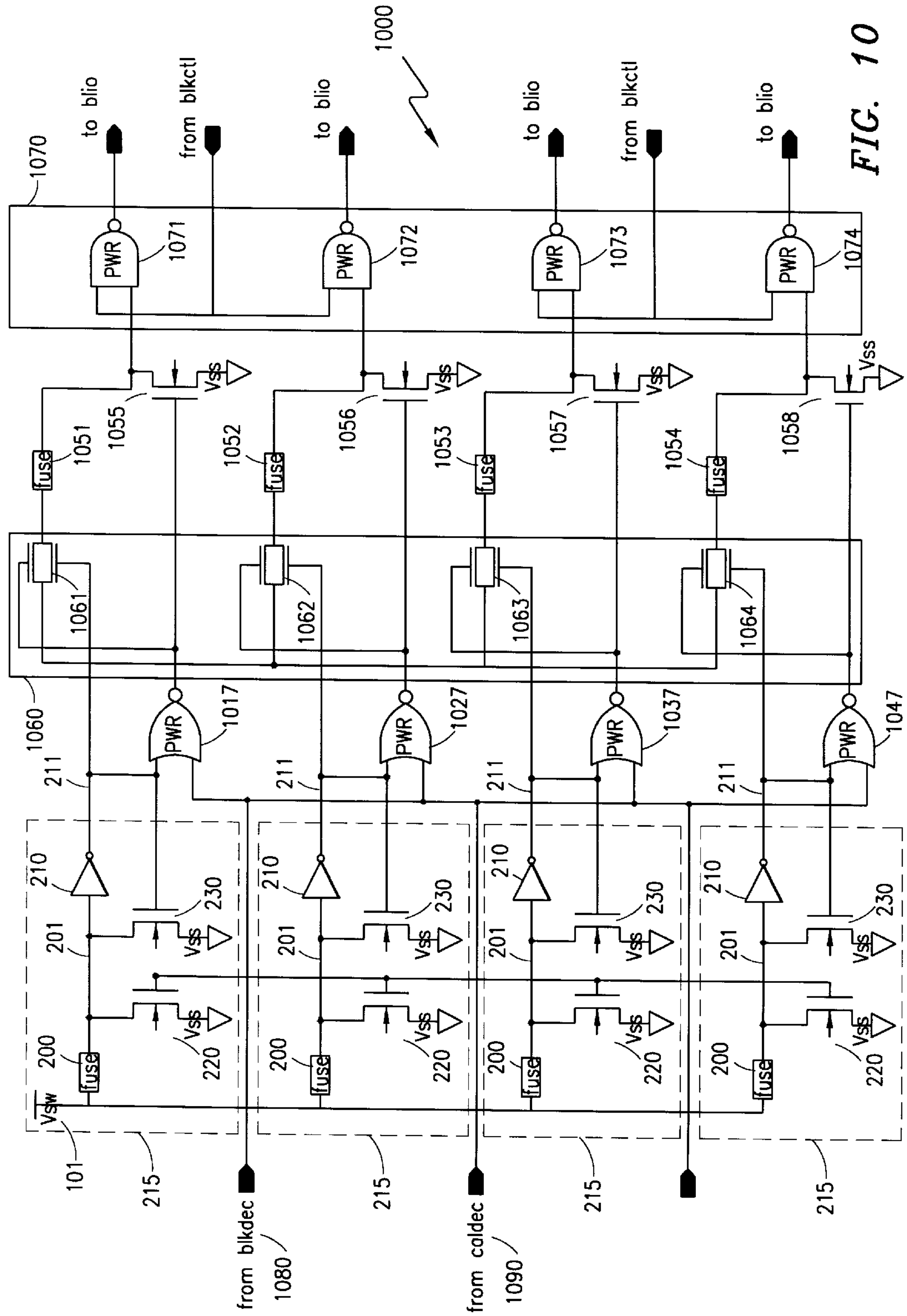
FIG. 10 is a schematic diagram illustrating master enable fuse circuits in accord with the present invention in a redundant column decoder.

In such a manner, master enable circuit 215 may provide an enabling signal to redundant row decoder 121 and redundant column decoder 131 as further illustrated for clarity in FIGS. 9 and 10.

A series of master enable circuits 215 in an exemplary redundant decoder circuit in accordance with the present invention is shown in FIG. 9. Redundant row decoder 900 is shown with the associated master enabling fuses 200 and master enable circuits 215 in accordance with the present invention. While only two master enable circuits are shown in FIG. 9, more may be present depending on the size of the memory and the number of redundant lines available for substitution. It is to be noted that while shown as single lines, the lines in FIG. 9, where noted, represent multiple lines and, accordingly, separate master enable circuits may be provided for each line 1:8. As previously described, particularly with reference to FIGS. 2 and 4, INITIAL signal 302 may be input to master enable circuits 215 at control junction 221 of junction device 220. If master enable fuses 200 are blown, then master enable signals 211 through the operation as previously described are locked high. Master enable signals 211 may allow the true address value through gate 903 for bank A, gate 913 for bank B, or the complement address value through gate 904 for bank A, gate 914 for gate B for address decode lines to be used depending on the state of fuses 901 and 902 for bank A and fuses 911 and 912 for bank B. It is further to be noted that one or the other of fuses 901, 902 or 911, 912 may be blown depending on whether the true or compliment address is desired to be decoded but not both. Junction devices 905 and 915 may allow the proper pull down function depending on whether the true or complement fuses 901, 902, 911, or 912 are blown.

FIG. 10 shows redundant column decoder 1000, with its associated master enable circuits 215 and master enable fuses 200. In redundant column decoder 1000, master enable signals 211 allow one of sixteen fused lines to be enabled depending on which of the sixteen fused lines is left intact as represented by fuses 1051–1054 associated with four column banks each having one out of sixteen possible lines intact. In addition, a true or a compliment may be achieved with each remaining line. Again, in response to INITIAL signal 302, the generation of which is described in reference to the foregoing Figures, master enable circuits 200 are initialized depending on the state of individual master enable fuses 215. Assuming a master enable fuse 215 is blown, INITIAL signal 302 initializes and locks master enable signal 211 to a high state by the operation as previously described. Master enable signals 211 may be coupled to column line selectors 1060 and depending on the state of WLLOFF signal 1080 and column select signal 1090, a particular column address may be achieved further depending on which of the sixteen lines has a fuse left intact as represented by fuses 1051–1054 previously described.

Thus, in accordance with the teachings of the present invention, robust operation is obtained while being powered from battery voltage, with no potential for unwanted DC currents. External Vcc 102 does not need to be bussed around within the device, resulting in die size savings. The only current to external Vcc 102 is during the short 3–5 ns pulse.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. An initialization circuit for initializing a master enable circuit in a redundant line decoder within a semiconductor memory array, the initialization circuit comprising:

voltage sensing and switching circuit for determining that a predetermined voltage level has been reached and for multiplexing a plurality of power sources to a single power bus for the semiconductor memory array, and a pulse generation circuit for generating an initialization pulse responsive to the predetermined voltage level being reached, the initialization pulse for initializing the master enable circuit to a known state in order to minimize undesirable currents within the semiconductor memory array, said master enable circuit being connected to said single power bus.

2. The initialization circuit as recited in claim 1, wherein the initialization pulse has a predetermined duration such that the duration of the initialization pulse is minimized.

3. The initialization circuit as recited in claim 2, wherein the master enable circuit includes a master enable fuse, wherein the master enable fuse is coupled to said single power bus.

4. The initialization circuit as recited in claim 2, wherein the predetermined duration includes a duration in a range between three nanoseconds and five nanoseconds.

5. The initialization circuit as recited in claim 1, wherein the predetermined voltage level includes a voltage level in a range between a first an d second voltage threshold.

6. The initialization circuit as recited in claim 5, wherein the first voltage threshold is Vso and the second voltage threshold is Vpfd, Vso and Vpfd being generated by said voltage sensing and switching circuit.

7. The initialization circuit as recited in claim 5, wherein the predetermined voltage level includes a PD voltage indicative of a predetermined power down voltage level.

8. A method for initializing a master enable circuit in a redundant line decoder within a semiconductor memory array, the method comprising:

utilizing a switching circuit to multiplex a plurality of power sources onto a single power bus for said semiconductor memory array;

determining that a predetermined voltage level has been reached;

generating an initialization pulse in response to determining that the predetermined voltage level has been reached, the initialization pulse being for initializing the master enable circuit to a known state in order to minimize undesirable currents within the semiconductor memory array.

9. The method as recited in claim 8, wherein the initialization pulse is of a predetermined duration.

10. The method as recited in claim 9, wherein the predetermined duration includes a duration in a range between 3 nanoseconds and 5 nanoseconds.

11. The method as recited in claim 8, wherein the predetermined voltage level includes a voltage level in a range between a first and second voltage threshold.

12. The method as recited in claim 11, wherein the first voltage threshold is Vso and the second voltage threshold is Vpfd.

13. A initialization circuit as recited in claim 11, wherein the predetermined voltage level includes a PD voltage indicative of a predetermined power down voltage level.

14. A semiconductor device comprising:

an address decoder;

a memory array in electrical communication with said address decoder;

a redundant row circuit;

a redundant row decoder in electrical communication with said redundant row circuit;

a pulse generator circuit, said pulse generator circuit comprising a band-gap circuit and a pulse generation circuit, said pulse generator circuit providing an initialization signal to said redundant row decoder; and a sensing circuit for determining whether a predetermined voltage level has been reached and for providing predetermined signals to said pulse generation circuit.

15. The semiconductor device of claim 14, further comprising a switching circuit for receiving a plurality of voltages and multiplexing said voltages onto a single power bus for powering circuitry on said semiconductor device.

16. The semiconductor device of claim 14, wherein said redundant row decoder comprises at least one fuse connected to said a switched power bus, said switched power bus providing power from one of a plurality of power sources.

* * * * *